(12) United States Patent
Venkatagiriyappa et al.

(10) Patent No.: US 9,786,629 B2
(45) Date of Patent: Oct. 10, 2017

(54) DUAL-SIDE REINFORCEMENT FLUX FOR ENCAPSULATION

(71) Applicant: Alpha Assembly Solutions Inc., Waterbury, CT (US)

(72) Inventors: Ramakrishna Hosur Venkatagiriyappa, Bangalore (IN); Sutapa Mukherjee, Bangalore (IN); Harish Hanchina Siddappa, Bangalore (IN); Morgana De Avila Ribas, Bangalore (IN); Siuli Sarkar, Bangalore (IN); Bawa Singh, Marlton, NJ (US); Rahul Raut, Edison, NJ (US)

( * ) Notice: Subject to any disclaimer, the term of this patent is extended or adjusted under 35 U.S.C. 154(b) by 0 days.

(21) Appl. No.: 14/908,986

(22) PCT Filed: Jul. 31, 2014

(86) PCT No.: PCT/US2014/049046
§ 371 (c)(1),
(2) Date: Jan. 29, 2016

(87) PCT Pub. No.: WO2015/017615
PCT Pub. Date: Feb. 5, 2015

(65) Prior Publication Data
US 2016/0163672 A1    Jun. 9, 2016

(30) Foreign Application Priority Data

Aug. 2, 2013 (IN) .......................... 3497/CHE/2013

(51) Int. Cl.
*H01L 21/56* (2006.01)
*H01L 23/29* (2006.01)
(Continued)

(52) U.S. Cl.
CPC ............ *H01L 24/81* (2013.01); *H01L 21/563* (2013.01); *H01L 22/12* (2013.01); *H01L 23/293* (2013.01); *H01L 24/29* (2013.01); *H01L 24/13* (2013.01); *H01L 24/16* (2013.01); *H01L 24/32* (2013.01); *H01L 24/73* (2013.01); *H01L 24/92* (2013.01); *H01L 2224/13101* (2013.01); *H01L 2224/13111* (2013.01); *H01L 2224/16225* (2013.01); *H01L 2224/2919* (2013.01); *H01L 2224/32225* (2013.01); *H01L 2224/73204* (2013.01); *H01L 2224/81011* (2013.01);
(Continued)

(58) Field of Classification Search
CPC ..................................................... H01L 21/563
See application file for complete search history.

(56) References Cited

U.S. PATENT DOCUMENTS

| 2004/0234689 A1 | 11/2004 | Morganelli et al. |
| 2005/0129956 A1 | 6/2005 | Rubinsztajn et al. |

(Continued)

OTHER PUBLICATIONS

Notification of Transmittal of the International Search Report and the Written Opinion of the International Searching Authority from corresponding PCT/US2014/049046 dated Nov. 17, 2014.

*Primary Examiner* — Alexander Ghyka
(74) *Attorney, Agent, or Firm* — Carmody Torrance Sandak & Hennessey LLP

(57) ABSTRACT

Dual-side reinforcement (DSR) materials and methods for semiconductor fabrication. The DSR materials exhibit the properties of conventional underfill materials with enhanced stability at room temperature.

9 Claims, 5 Drawing Sheets

(51) Int. Cl.
*H01L 23/00* (2006.01)
*H01L 21/66* (2006.01)
*H05K 3/28* (2006.01)
*H05K 3/34* (2006.01)

(52) U.S. Cl.
CPC ............... *H01L 2224/81024* (2013.01); *H01L 2224/81026* (2013.01); *H01L 2224/81192* (2013.01); *H01L 2224/81815* (2013.01); *H01L 2224/81908* (2013.01); *H01L 2224/83855* (2013.01); *H01L 2224/92125* (2013.01); *H01L 2924/0133* (2013.01); *H05K 3/284* (2013.01); *H05K 3/3436* (2013.01); *H05K 3/3489* (2013.01); *H05K 2201/10734* (2013.01); *H05K 2201/10977* (2013.01)

(56) References Cited

U.S. PATENT DOCUMENTS

| | | | |
|---|---|---|---|
| 2006/0252177 A1 | 11/2006 | Shim et al. | |
| 2009/0075429 A1* | 3/2009 | Sato | H01L 23/293 438/118 |
| 2010/0041823 A1* | 2/2010 | Dershem | C08G 77/045 524/588 |
| 2010/0143658 A1 | 6/2010 | Lawrence | |
| 2011/0065242 A1* | 3/2011 | Chan | H01L 21/563 438/127 |
| 2011/0194260 A1* | 8/2011 | Jung | H05K 3/3452 361/746 |
| 2013/0295721 A1* | 11/2013 | Lyu | H01L 21/50 438/108 |

* cited by examiner

DUAL-SIDE REINFORCEMENT FLUX FOR ENCAPSULATION

CROSS-REFERENCE TO RELATED APPLICATIONS

This application is a U.S. National Phase Application under 35 U.S.C. §371 of International Application No. PCT/US2014/049046, filed Jul. 31, 2014, titled DUAL-SIDE REINFORCEMENT FLUX FOR ENCAPSULATION, which claims priority to Indian Patent Application No. 3497/CHE/2013, filed Aug. 2, 2013. These prior applications are incorporated by reference herein in their entirety.

FIELD OF THE TECHNOLOGY

One or more aspects relate generally to the electronics industry and, more specifically, to materials and methods for semiconductor packaging.

BACKGROUND

There has been an increasing demand for innovative products that can be used as an alternative to conventional underfill materials in semiconductor packaging at both the board and component levels. Assembly manufacturers seek alternative highly stable underfill materials to facilitate easy processing of packaging material in the electronics industry under various conditions.

SUMMARY

In accordance with one or more aspects, dual-side reinforcement materials and methods are provided.

One aspect of the present disclosure is directed to a method of applying dual-side reinforcement (DSR) material on a device during an assembly process. In one embodiment, the method comprises printing solder paste material on a printed circuit board substrate, picking a ball grid array device with a pick-and-place apparatus, dipping the device into a printed flux package on package (PoP) machine, and placing the device onto a pad of solder paste on the substrate.

Aspects of the method may further include applying heat to the substrate to reflow the device to attach the device to the substrate. The method further may comprise, after applying heat to the substrate to reflow the device, completely filling a gap between the device and the substrate with curable DSR material. The method further may comprise analyzing the curable DSR material under the device by a scanning electron microscope.

Another aspect of the disclosure is directed to a dual-side reinforcement material exhibiting the properties of underfill materials with enhanced stability at room temperature. In one embodiment, the material comprises a mixture of resin, hardener, catalyst, and at least one other additive, which are stable at room temperature.

Aspects of the dual-side reinforcement material further include the material achieving mechanical properties of traditional underfill materials, and/or the material achieving drop shock properties of traditional underfill materials.

Still other aspects, embodiments, and advantages of these exemplary aspects and embodiments, are discussed in greater detail below. Moreover, it is to be understood that both the foregoing information and the following detailed description are merely illustrative examples of various aspects and embodiments, and are intended to provide an overview or framework for understanding the nature and character of the claimed aspects and embodiments. The accompanying drawings are included to provide illustration and a further understanding of the various aspects and embodiments, and are incorporated in and constitute a part of this specification. The drawings, together with the remainder of the specification, serve to explain principles and operations of the described and claimed aspects and embodiments.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the disclosed embodiments, and are not intended as a definition of the limits of such embodiments. For purposes of clarity, not every component may be labeled in every drawing. In the following description, various embodiments are described with reference to the following drawings, in which.

DETAILED DESCRIPTION

Figure 1:
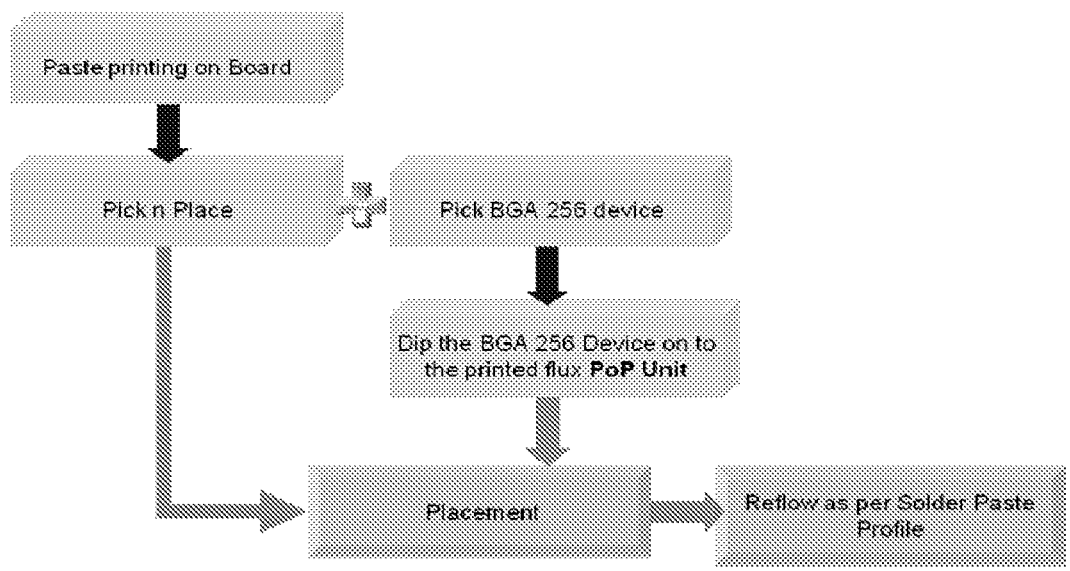
FIG. 1 is a flow chart of a method of applying dual-side reinforcement (DSR) material in accordance with one or more embodiments.

Various embodiments described herein are not limited in their application to the details of construction and the arrangement of components as set forth in the following description or illustrated in the drawings. One or more embodiments are capable of being practiced or carried out in various ways beyond those exemplarily presented herein.

At present, conventional thermosetting polymer based underfill materials are widely used as packaging material to enhance or to increase the mechanical properties of the material. Underfill materials widely used in the process of encapsulation in the electronics industry are sensitive to temperature and if exposed to room temperature may cause problems like pre-curing. This and exposure to air in turn may cause viscosity build up in the underfill material which leads to processing issues. Thus, the use of conventional underfill materials has some inherent disadvantages as they require a separate curing process apart from the standard reflow process and the underfill materials have to be stored below −4° C.

In accordance with one or more embodiments, materials and methods may address these disadvantages of conventional underfill materials. In some embodiments, material disclosed herein may be applied and will act as a traditional underfill material, and can be used in standard reflow processes to cure the material. After curing, the material will tend to have the properties of underfill material, exhibit room temperature stability, and can be stored and used without any additional measures. The disclosed DSR material is a material which has excellent room temperature stability. In some non-limiting embodiments, the DSR material is stable at room temperature for at least twenty days. The disclosed materials are also stable in terms of viscosity. Beneficially, no separate curing process apart from standard reflow processes is required.

As used herein, reflow soldering may generally refer to a process in which solder paste is printed or dispensed, or a solder preform is placed, or both, on a surface of a printed circuit board, components are placed in or near the deposited solder, and the assembly is heated to a temperature sufficient to reflow the solder.

In accordance with one or more embodiments, a dual-side reinforcement (DSR) material may exhibit properties of conventional underfill materials but with enhanced stability at room temperature. In at least some embodiments, the DSR material includes a mixture of a resin, a hardener, a catalyst and at least one other additive, which are all generally stable at room temperature.

In accordance with one or more embodiments, methods of applying the DSR material are disclosed. To apply the DSR material, one method includes printing solder paste material on a printed circuit board substrate, picking a ball grid array device with a pick-and-place apparatus, dipping the device into a printed flux package on package (PoP) machine, and placing the device onto a pad of solder paste on the substrate.

The term "dual-side reinforcement material" or "DSR material" as used herein may refer to a type of flux-containing curable composition. The composition may include one or more of a resin, a hardener, and a catalyst and any other required additives. A fluxing agent may or may not be present in it. In at least some embodiments, no fluxing agent is present. When the DSR material is subjected to heat such as via a reflow process, the material may undergo a three dimensional cross-linking reaction to form a hard solid mass around the solder joint and any gap between the BGA balls and the substrate, thereby acting as an underfill material.

In accordance with one or more non-limiting embodiments, a DSR material may include one or more of the following components at the indicated weight percents:
 a) Organic solvents with high boiling points 30-40 wt %
 b) Different functionality epoxy resins 5-10 wt %
 c) Solid epoxy resin with high molecular weight and bi-functional 15-30 wt %
 d) Di carboxylic acid as an activator 3-10 wt %
 e) Substituted aromatic amine as catalyst 2-8 wt %
 f) Phosphene based salt as catalyst 1-5 wt %
 g) Liquid anhydride type hardener/catalyst 1-5 wt %
 h) Liquid type stress modifier 0.1 to 4 wt %
 i) Adhesion promoters 0.1-3 wt %
 j) Reinforcing fillers 20-50 wt %

In accordance with one or more embodiments, the stability and desired viscosity of the material may be attributed to the ratio between the type of epoxy resin and the hardening agent. The catalyst used should generally be low reactive at room temperature and the cross-linking should happen only at an elevated temperature (processing temperature). Preferably, the cross-linking should start after the solder melts. If the epoxy undergoes cross-linking before the solder melts, the cross-linked epoxy may become hard and the hardened epoxy may not allow the molten solder to form a proper joint on the electronic circuit board. In accordance with one or more embodiments, the combination of epoxy and hardening agent may trigger the cross-linking reaction at elevated temperatures after the solder melts. The hardened/cross-linked epoxy may form a collar around the solder joint and may reduce the transfer of applied stress on the solder joint.

In at least some embodiments, the components may be mixed in a desired ratio and subjected to milling, such as three roll milling. After having confirmation of, for example, FOG <10 micron, the milling process may be stopped. The milled sample may then be mixed with a desired amount of reinforcing fillers to obtain a final DSR product.

In accordance with one or more non-limiting embodiments, the viscosity of the DSR material may be in the range of about 100 to 500 Pa·S. The calorimetric property of the DSR materials may be measured by DSC to determine peak cure temperature which should generally be above the solder melting point. The glass transition temperature (Tg) and co-efficient of thermal expansion (CTE) of the DSR material may be measured by Thermo Mechanical Analyzer (TMA) and the storage modulus of the material may be measured by Dynamic mechanical Analysis (DMA).

In accordance with some embodiments, a method for the application of a DSR material is provided that can be applied easily by a PoP machine. The DSR material may have a non-fluxing property that is intended to work as an underfill material. After applying the DSR material (sometimes referred to as "flux") by PoP, the DSR material may undergo cross-linking under standard SMT reflow.

FIG. 1 illustrates an exemplary embodiment of a method of applying DSR material. As shown, the method may involve printing solder paste material on a printed circuit board substrate, picking a ball grid array device with a pick-and-place apparatus, dipping the device into a printed flux package on package (PoP) machine, and placing the device onto a pad of solder paste on the substrate. After the reflow process, a gap between the component and the board may be completely filled with curable DSR material.

In accordance with one or more embodiments, various process parameters of the method may be controlled. These may include, for example, dipping time, dipping height, and rise velocity of the dipped component. The dipping time may be significant in that it determines the amount of flux transfer on each solder ball in the BGA. The amount of flux transfer on each ball may impact the final mechanical reliability properties of the assembled package. A greater dip time may lead to higher mechanical properties of the package. Typically, the dip time may vary from smaller packages to bigger packages. In some non-limiting embodiments, a dip time of about 0.1 sec to about 5 sec may be recommended. Dipping height may also contribute to achieving high mechanical strength of the final package. In some non-limiting embodiments, dipping height may vary from about 50% to about 90% depending on the package and the final mechanical reliability requirement for the given package. In some specific embodiments, about 90% of the ball height of the BGA package is recommended as a dipping height. Rise velocity is generally recognized as the speed at which the equipment will lift the component from the flux tray of DSR material. The rise velocity should be optimized for different types of packages prior to processing.

In accordance with one or more embodiments, a DSR material has the properties of conventional underfill materials but with excellent stability at room temperature. Traditional underfill materials are not stable at room temperature and their viscosity is impacted which negatively effects their flow ability and curability upon processing. The presently disclosed DSR materials are stable at room temperature and will tend to yield all the beneficial mechanical properties of underfill materials.

The methods and compositions described herein may be used in applications including, but not limited to, printed circuit board fabrication, LED assembly, photovoltaic cell fabrication, semiconductor fabrication, and die attachment.

The function and advantage of these and other embodiments of the materials and methods disclosed herein will be more fully understood from the examples below. The following examples are intended to illustrate the benefits of the disclosed materials and methods, but do not exemplify the full scope thereof.

EXAMPLE 1

Figure 2:
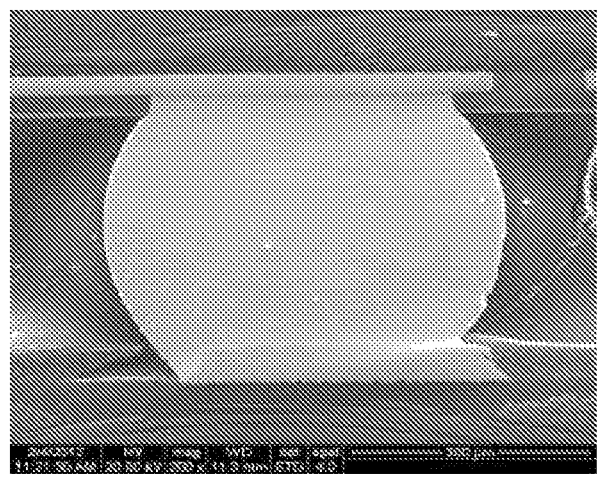
FIG. 2 is a photograph taken with a scanning electron microscope (SEM) of a DSR material filled package in accordance with one or more embodiments.

Analysis of a curable DSR material under a component was done by a scanning electron microscope (SEM) as shown in FIG. 2. From the SEM image, it is evident that the gap between the board and BGA component is completely filled with curable DSR material and that there are no voids. This voidless, completely filled DSR material is responsible for enhancing the mechanical reliability of the components on the board.

EXAMPLE 2

Figure 3:
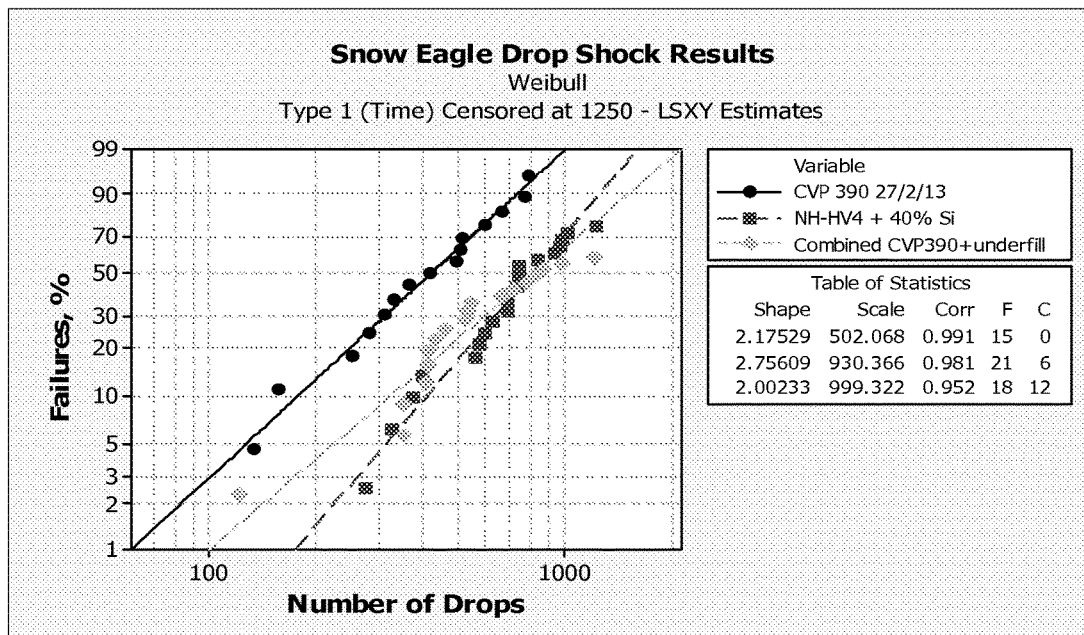
FIG. 3 presents drop shock data discussed in an accompanying Example.

Drop shock properties of the DSR material were compared to a standard underfill material stay Chip 3082 as shown in FIG. 3.

The weibull plot of FIG. 3 shows drop shock data of standard SMT solder paste, standard SMT solder paste with underfill material Staychip3082, and Standard SMT solder paste with DSR material (NHHV4+40% Si). When compared, it is evident that the drop shock property of solder paste with underfill material is much higher compared to standard solder paste.

Further, it is also confirmed that the DSR material is equivalent to the underfilled and reflowed board. From this drop shock data, it is well confirmed that the DSR material behaves like an underfill material.

EXAMPLE 3

Figure 4:
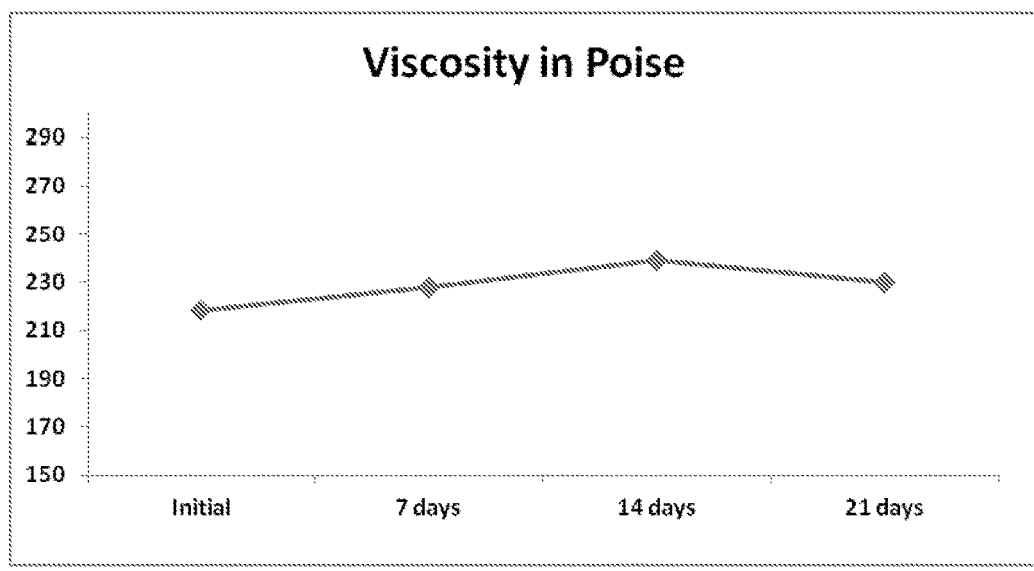
FIG. 4 is a graph showing viscosity stability of a DSR material in accordance with one or more embodiments.

The stability of DSR material was determined by using a Malcolm viscometer and the viscosity of the DSR material was measured at regular intervals of time. Viscosity data from the Malcolm viscometer is shown in FIG. 4. The DSR material showed excellent stability.

EXAMPLE 4

Figure 5:
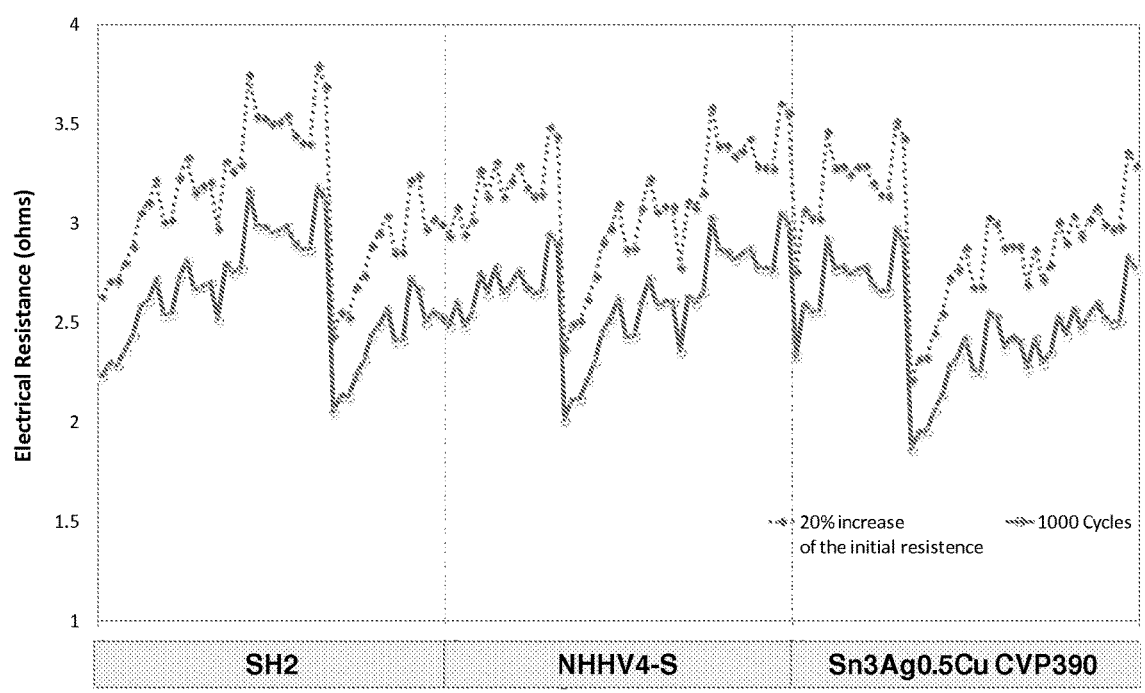
FIGS. 5 and 6 present data from a thermal cycling test discussed in an accompany Example.
Figure 6:
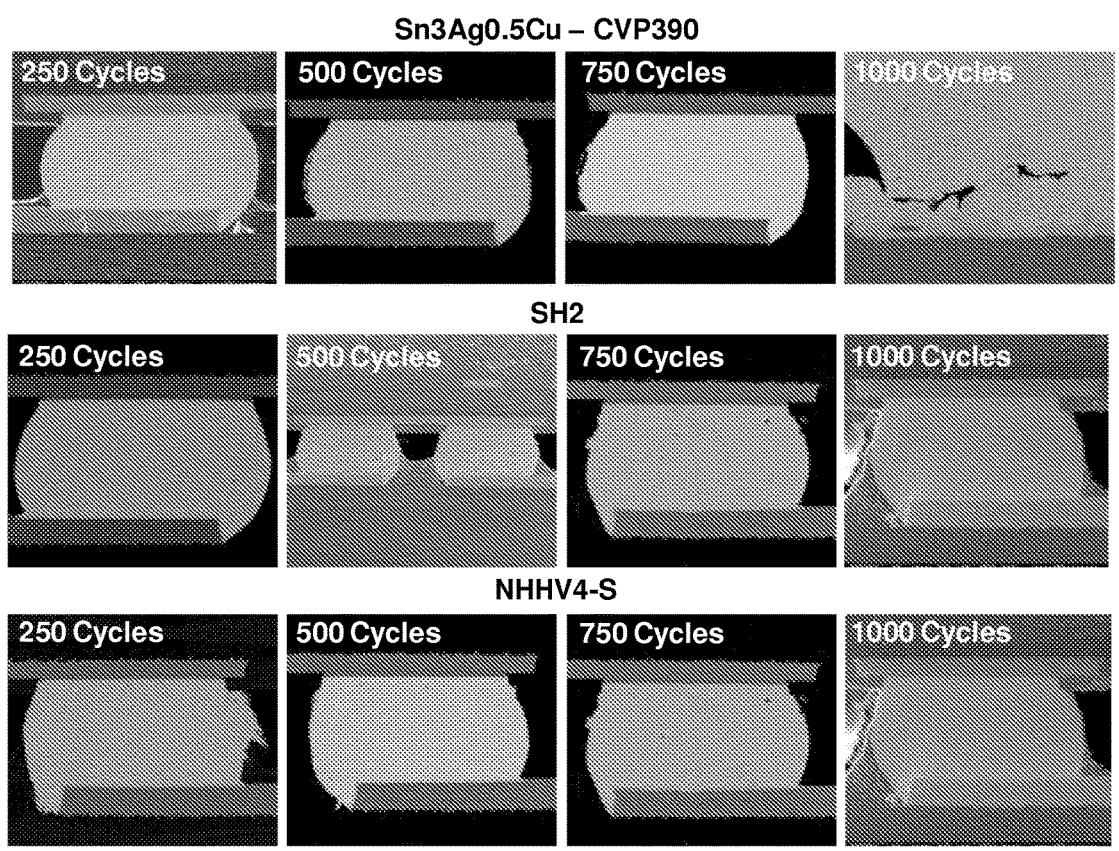

A thermal cycling test was conducted according to the IPC 9701-A standard (0° C. (10 min) to +125° C. (10 min) for 1000 cycles). Cross-section and microscopic observation of BGAs after 1000 cycles were performed for failure analysis. A failure was defined as a 20% increase in nominal resistance within a maximum of 5 consecutive reading scans. The data is presented in accompanying FIG. 5. As illustrated, the electrical resistance did not increase more than 20% for any of the pastes. FIG. 6 presents the cross-sections after thermal cycling.

Both SH2 and NHHV4-S passed 1000 thermal cycles from 0° C. to +125° C. (10 min dwell time). For SH2 and NHHV4-S, no cracks were observed on the solder sphere or flux material up to 1000 thermal cycles. For Sn3Ag0.5Cu CVP390 solder paste, without the addition of SH2 or NHHV4-S, cracks appeared after 750 cycles. Thus, SH2 and NHHV4-S offered additional resistance to the solder joint against cyclic expansion (caused by CTE mismatch) during thermal cycling test.

EXAMPLE 5

Drop shock properties of the disclosed DSR materials were compared to conventional solder paste according to JEDEC standard JESD22-B111 "Board Level Drop Test Method of Components for Handheld Electronic Products" using service condition B (1500Gs, 0.5 msec pulse, half-sine curve). Failure detection was defined as the first event of intermittent discontinuity followed by 3 additional such events during 5 subsequent drops.

Figure 7:
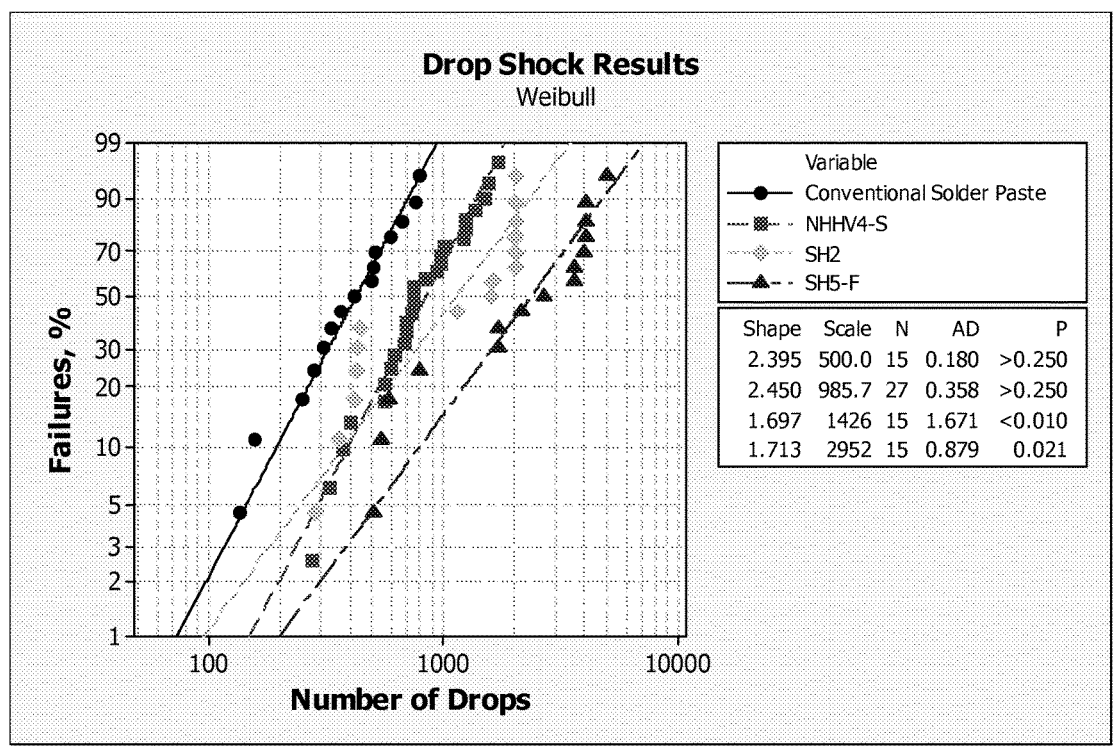
FIG. 7 presents drop shock data discussed in an accompanying Example.

The data is presented in FIG. 7. NHHV4-S and SH2 drop shock characteristic lives were about 2× and 3× higher, respectively, than with conventional solder paste only. SH5-F drop shock characteristic life was almost 6× higher than with conventional solder paste only.

It is to be appreciated that embodiments of the compositions and methods discussed herein are not limited in application to the details of construction and the arrangement set forth herein. The compositions and methods are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiment.

Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only.

What is claimed is:

1. A method of applying dual-side reinforcement (DSR) material on a device during an assembly process, the method comprising the steps of:
    printing solder paste material on a printed circuit board substrate;
    picking a ball grid array device with a pick-and-place apparatus;
    dipping the device into a printed flux package on package (PoP) machine; and
    placing the device onto a pad of solder paste on the substrate;
    applying heat to the substrate to reflow the device to attach the device to the substrate;
    filling a gap between the device and the substrate with a curable DSR material;
    wherein the DSR material comprises an epoxy and a hardening agent; and
    wherein the combination of epoxy and hardening agent triggers a cross-linking reaction only at elevated temperatures after the solder paste material melts.

2. The method of claim 1, further comprising analyzing the curable DSR material under the device by a scanning electron microscope.

3. The method of claim 1, characterized by a dipping time of about 0.1 sec to about 5 sec.

4. The method of claim 1, characterized by a dipping height of about 50% to about 90%.

5. A method according to claim 1 wherein the DSR material comprises a dicarboxylic acid.

6. A method according to claim 1 wherein the DSR material comprises a substituted aromatic amine.

7. A method according to claim 1, wherein the DSR material comprises a phosphene based salt.

8. A method according to claim 1, wherein the DSR material comprises a liquid anhydride type hardener.

9. A method according to claim 1, wherein the DSR material has a viscosity in the range of about 100 to 500 PaS.

* * * * *